United States Patent [19]

Lerma

[11] 4,211,981

[45] Jul. 8, 1980

[54] INTEGRATOR WITH DIELECTRIC ABSORPTION CORRECTION

[75] Inventor: Jesse P. Lerma, La Habra, Calif.

[73] Assignee: Abbott Laboratories, North Chicago, Ill.

[21] Appl. No.: 902,599

[22] Filed: May 4, 1978

[51] Int. Cl.[2] .......................... H03K 5/00; G06G 7/18

[52] U.S. Cl. .................................... 328/127; 307/230; 328/151

[58] Field of Search ........................ 328/127, 128, 151; 307/229, 230

[56] References Cited

U.S. PATENT DOCUMENTS

| | | | |
|---|---|---|---|
| 3,529,245 | 9/1970 | Single | 328/127 |
| 3,660,769 | 5/1972 | Jordan et al. | 328/127 |
| 3,667,055 | 5/1972 | Uchida | 328/127 |
| 3,961,205 | 6/1976 | Kuligowski et al. | 307/229 |
| 4,114,050 | 9/1978 | Lerche | 328/151 |

*Primary Examiner*—Stanley D. Miller, Jr.
*Assistant Examiner*—B. P. Davis
*Attorney, Agent, or Firm*—Merriam, Marshall & Bicknell

[57] ABSTRACT

An improved electronic integrator enabling compensation or correction for the error in integration due to inherent dielectric absorption in the integrating capacitor. A sampling amplifier samples the error during a sampling interval and develops a correction voltage representative of the error. During the next sequential integration interval the correction voltage is transferred to the integrating capacitor to counteract and thereby compensate for dielectric absorption in the integrating capacitor. Timed control means provide the sequential timing and operation of the apparatus.

9 Claims, 4 Drawing Figures

FIG. 1
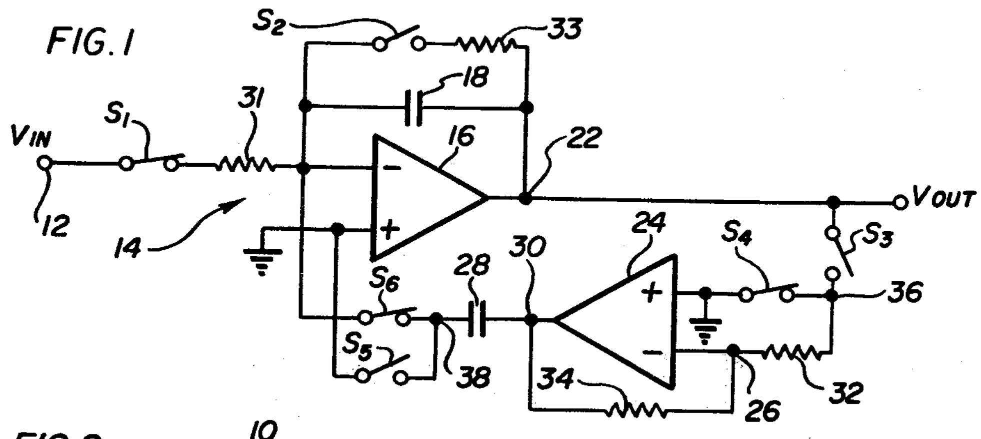
FIG. 2
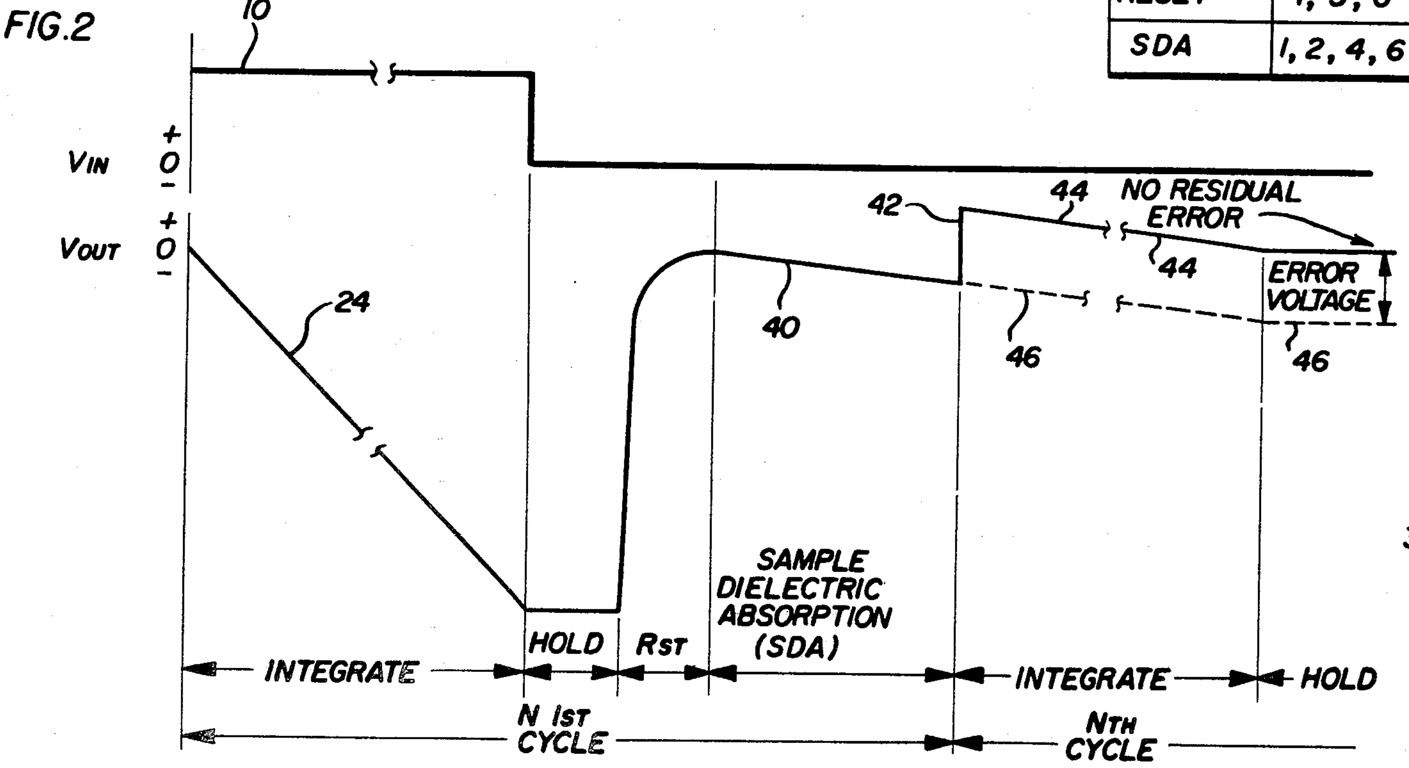
FIG. 3
SWITCH CLOSURE TRUTH TABLE
| TIME | SWITCHES OPEN | SWITCHES CLOSED |
|---|---|---|
| INTEG. | 2, 3, 5 | 1, 4, 6 |
| HOLD | 1, 2, 3 | 4, 5, 6 |
| RESET | 1, 3, 6 | 2, 4, 5 |
| SDA | 1, 2, 4, 6 | 3, 5 |
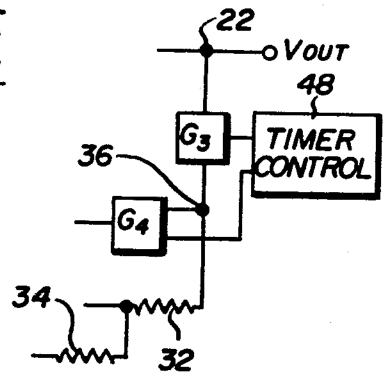
FIG. 4

INTEGRATOR WITH DIELECTRIC ABSORPTION CORRECTION

This invention relates to electronic integrating circuits, and more particularly to apparatus and methods for eliminating the error in integration due to the inherent dielectric absorption in the integrating capacitor.

BACKGROUND

Reference may be made to the following U.S. Pat. Nos. of interest: 3,047,808; 3,381,230; 3,475,689; 3,529,245; 3,891,840; 3,119,984; 3,476,924; 3,512,140; 3,541,320; 3,541,446; 3,566,265; 2,667,055; 3,714,591; 3,778,725; 3,784,919; and 3,942,172.

Electronic integrating circuits commonly employ an amplifier with an integrating capacitor connected in parallel between the amplifier output and input terminals. Due to a phenomena known as "dielectric absorption" occurring in the integrating capacitor, the integration results are subject in a small amount of error. In some circumstances the integration error is tolerable. However in systems requiring integration precision, it is not only desirable but necessary to remove or substantially eliminate the error due to dielectric absorption.

Dielectric absorption is a fundamental property of all capacitors in which a small percentage of the energy stored during integration is not immediately recoverable upon discharge of the capacitor, but rather is released at a rate governed by the physical characteristics of the dielectric material forming the capacitor. This phenomena is believed to occur as a result of space charge polarization within the capacitor's dielectric material leading to an apparent increase in capacitance. The macroscopic effects of dielectric absorption are most commonly observed as a residual error voltage build-up across the previously discharged integrating capacitor. The error voltage increases to a maximum value, linearly related to the voltage across the integrating capacitor prior to discharge. Upon reaching this maximum value the error voltage then slowly declines at a rate governed by the internal and external shunting impedances. The occurrence of such a residual error voltage build-up in a desired precision integrating circuit can seriously limit the integration resolution and accuracy.

One attempt to lessen the effect of dielectric absorption is to utilize high quality capacitors for the integrating capacitor, however such desirable capacitors are more expensive and occupy a volume an order of magnitude greater than a comparable capacitor of lesser quality. An alternative solution is to allow sufficient time between integrating periods to insure that the dielectric absorption voltage has declined to zero. In many cases this is not a viable solution, particularly where the integration circuit is to first integrate a large amplitude signal prior to reset and subsequently integrate a relatively small amplitude signal.

SUMMARY OF THE INVENTION

Means are provided in an electronic integrator circuit to compensate or correct for the error voltage due to the dielectric absorption characteristics of the integrating capacitor. In particular, in accordance with the method aspect of the present invention, the error voltage due to the dielectric absorption phenomena is sampled after integration and reset discharging of the integrating capacitor. The sampled voltage, which represents the magnitude of the dielectric absorption voltage build-up on the integrating capacitor at the sampling instant, is used to correct the integrator circuit for the subsequent behavior of the phenomena after the sampling instant. Correction is achieved by applying the sampled voltage linearly scaled and inverted to the integrating capacitor during the next integration cycle to counteract the remaining dielectric absorption error voltage. It can be shown that corrections based on linear extrapolation of the sampled error voltage can null the effects of dielectric absorption given a constant integration period.

In accordance with the apparatus aspect of this invention, voltage sampling means are coupled by timed switching means to the integrating capacitor after an integration cycle for sampling the error voltage due to dielectric absorption. The timed switching means subsequently couples the sampled voltage to the integrating capacitor during the next integrating cycle to counteract the error voltage.

In the preferred embodiment illustrated and described, a second amplifier and a second capacitor are coupled by timed switching means, such as logic gates, to the output of the integrating capacitor after the end of an integrating cycle to charge the second capacitor to a sample voltage representing the dielectric absorption error voltage. During the next integrating cycle the timed switching means couples the second capacitor to the integrating capacitor for transferring the sample voltage to the integrating capacitor thereby compensating for the dielectric absorption phenomena.

BRIEF DESCRIPTION OF THE DRAWINGS

FIG. 1 is a schematic block diagram illustrating an electronic integrator including means for compensating for the normal error voltage in the integrating capacitor due to dielectric absorption phenomena;

FIG. 2 is a timing diagram illustrating the sampling time interval during which the error voltage is sampled and the next integrating interval during which the sampled voltage is used to correct the error voltage;

FIG. 3 is a truth table specifying the operation of the switches or gates in the circuit of FIG. 1 in accordance with the timing diagram of FIG. 3; and FIG. 4 is an additional block diagram schematically illustrating the application of timed control signals to logic gates for gating two of the switches schematically shown in FIG. 1.

DETAILED DESCRIPTION

Referring now to FIGS. 1 and 2, the application of an input signal 10 is applied to terminal 12 of an electronic integrating circuit 14. The standard integrator includes an amplifier 16 and a integrating capacitor 18 connected at respective ends to the amplifier input terminal 20 and the amplifier output terminal output 22. Thus, during application of the input signal 10, the integrator 14 provides an output signal 24, which output signal is, of course, an integral function of the input signal 10 over the "integrate" portion of the cycle as shown in FIG. 2.

In accordance with the principles of the present invention, there is provided a second amplifier 24 having an input terminal 26 which can be selectively coupled through switch $S_3$ to the integrating capacitor 18 at terminal 22. A second capacitor 28 is connected to the output of amplifier 24 at terminal 30 and can be connected through switch $S_6$ to the input of integrating capacitor 18 and terminal 20. A resistor 32 is connected intermediate switch $S_3$ and the input terminal 26 of amplifier 24. Also, a resistor 34 is connected between the input terminal 26 and the output terminal 30 of amplifier 24. Thus, the amplifier 24 amplifies and inverts an input signal in accordance with the ratio $R_{34}/R_{32}$.

As can be seen from FIG. 1, switch $S_4$ is interconnected between a grounding connection at the positive input of amplifier 24 and point 36 which is a common point with switch $S_3$. Additionally, switch $S_5$ is connected to a common point 38 with switch $S_6$ and at the other end to the grounded positive input of amplifier 16.

Reference may be made to the truth table in FIG. 3 which correlates the respective time intervals of FIG. 2 with open or closed positions of the switches. For instance, during the "Integrate" interval wherein input signal 10 is applied to terminal 12 so as to obtain the output signal 24 at terminal 22, switches $S_1$, $S_4$, and $S_6$ are closed whereas switches $S_2$, $S_3$ and $S_5$ are opened. Next, the circuit is placed into a "Hold" interval wherein the results of integration can be read out at terminal 22 through conventional means, and the circuit is then placed in the "Reset" mode during which the integrating capacitor 18 is discharged.

In accordance with the principles of the present invention, switches $S_3$ and $S_5$ are then closed whereas switches $S_1$, $S_2$, $S_4$ and $S_6$ are opened to enable amplifier 24 and the second capacitor 28 to operate as a sample and hold correction circuit. This mode has been termed the "Sample Dielectric Absorption (SDA)" mode and is illustrated in FIG. 2. It must be particularly noted at this time that the output signal portion 40 represents a charge build-up of the integration capacitor 18 which is coupled to the output terminal 22. Thus, the sampled voltage being amplified and inverted by amplifier 24 according to the ratio $R_{34}/R_{32}$, is stored on capacitor 28 and represents the error voltage at any sampling instance due to dielectric absorption.

At the start of the next "Integration" mode, switches $S_4$ and $S_6$ are closed and switches $S_3$ and $S_5$ are opened. The output of amplifier 24 is forced to ground by the closure of switch $S_4$. At the same time, the stored sampled voltage on capacitor 28 is allowed to discharge into the virtual ground of amplifier 24 by the closure of switch $S_6$. In effect, capacitor 28 has been commutated, removing the inversion associated with amplifier 24. The commutation of capacitor 28 is purposely designed to remove the influence of any offset voltages generated by amplifier 24.

Since the input of amplifier 16 is a virtual ground, the net effect of the discharge of the capacitor 28 is an immediate charge transfer to integration capacitor 18, resulting in a voltage step 42 at the output terminal 22 of amplifier 16, opposite in polarity to that voltage present immediately prior to the end of the sampling interval. The magnitude of this voltage step 42 is given by $V_{o/step}=(R_{34}\,C_{28}/R_{32}\,C_{18})\,[V_{o/sampled}]$. For a fixed value of capacitor 28, the ratio of resistor 34 to resistor 32 can be selected such that the voltage step 42 induced at the output of amplifier 16 exactly counteracts the effects of the remaining voltage due to dielectric absorption build-up on capacitor 18 during that "Integrate" interval of the cycle. Thus, the net effect of the correction is to instantaneously charge capacitor $C_{18}$ to a level proportional to the remaining charge on capacitor 18 due to the dielectric absorption phenomena, the charging level being of a polarity to counteract the subsequent dielectric absorption characteristics of capacitor 18 in the next "Integrate" interval.

In FIG. 2 the remaining portion 44 of the output signal waveform is shown as eventually decreasing to a zero level during the next "Integrate" and "Hold" cycle intervals. For purposes of illustration, it is presumed that no input signal is applied during the "Integrate" interval of the Nth cycle. Thus, the voltage step 42 exactly counteracts the error in capacitor 18 due to the dielectric absorption so that at the end of the "Hold" interval, capacitor 18 discharges to the zero level. Thus, there is shown the notation "No Residual Error". On the other hand, merely for purposes of illustration, there is illustrated in dashed lines an output signal waveform 46 which would occur without any compensation. That is, the integrator 14 would normally have provided a small error due to the dielectric absorption phenomena in the integrating capacitor, which error is represented by the deviation of the dashed line 46 below the zero signal level at the end of the "Hold" interval portions in the Nth cycle. This deviation has been shown in FIG. 2 as the "Error Voltage". It is to be understood of course that the correction applied at the beginning of the Nth cycle would be equally as valid should an input signal actually be present. The zero input signal condition in reality represents a "worst case" condition.

It is to be understood, that whereas the switches $S_1$ through $S_6$ are illustrated schematically in FIG. 1 as mechanical components, there can be readily provided semiconductor-type logic gating switches which can be appropriately triggered by suitable logic control signals to provide the timed operations shown in FIGS. 2 and 3. As an example, reference may be made to FIG. 4, wherein there is illustrated logic gate switches $G_3$ and $G_4$ representing for instance the switches $S_3$ and $S_4$ shown in FIG. 1. The gate switches $G_3$ and $G_4$ are triggered by a timer control 48 to provide the operations of switches $S_3$ and $S_4$ as shown in FIGS. 2 and 3. Similar logic gate switches can be provided for the other switches shown in FIG. 1. As an example, a CD4052 COS/MOS differential 4-channel multiplexer integrated circuit can be employed for such logic signal gating. Other types of electronic gating devices can be employed by those skilled in the art to respond to the control signals eminating from timer control 48.

In a constructed embodiment of the invention, capacitors 18 and 28 were 2.2 and 0.68 microfarads, respectively. The ratio of resistor 34 to resistor 32 was 6.4 with sampling occurring until about the midpoint of the linear increase in error voltage, i.e., at the end of "SDA" and the beginning of the "Integrate" interval in FIG. 2. These values were determined emperically and reflect the dielectric absorption characteristics of capacitor 18 which was a 2.2 microfarads, 50 V polycarbonate metal film capacitor. Since dielectric absorption is a strong function of the type and volume of the dielectric material the component values determined should compensate equally and generally similar capacitors. This was experimentally verified for a number of 2.2 microfarads, 50 V polycarbonate metal film capacitors.

The foregoing detailed description has been given for clearness of understanding only, and no unnecessary limitations should be understood therefrom as modifications will be obvious to those skilled in the art.

What is claimed is:

1. In an electronic integrating circuit, including an amplifier with input and output terminals, and an integrating capacitor, connected between said terminals, having dielectric absorption, the dielectric absorption causing an error voltage build-up on said integrating capacitor following an integration interval, wherein the improvement comprises:

a second amplifier having respective input and output terminals;

a second capacitor having one terminal connected to the second amplifier output terminal; and switch means for selectively coupling, in sequence, (1) immediately following an integration interval, the first amplifier output terminal to the second amplifier input terminal for sampling said error voltage and charging said second capacitor to a sampled voltage representing said error voltage, and (2) during the next integration interval, the other terminal of said second capacitor to the first amplifier input terminal for transferring said sampled voltage to said integrating capacitor to substantially counteract said error voltage during the next integration interval.

2. The improvement of claim 1, wherein said switch means includes means for coupling said other terminal of said second capacitor to ground immediately following an integration interval for charging said second capacitor to said sampled voltage representing said error voltage.

3. The improvement of claim 1, wherein said second amplifier includes a signal inverting input terminal and said switch means includes means for coupling said second amplifier signal inverting input terminal to said integrating circuit for sampling said error voltage after integration.

4. The improvement of claim 3, wherein said second amplifier includes a signal non-inverting input terminal and said switch means includes means for coupling said second amplifier signal non-inverting input terminal to ground and decoupling said second amplifier signal inverting input terminal from said integrating capacitor during an integration interval.

5. In an electronic integrating circuit, including an integrating amplifier with input and output terminals, and an integrating capacitor, connected between said terminals, having dielectric absorption, the dielectric absorption causing an error voltage upon integration, wherein the improvement comprises:

sample means for sampling the error voltage immediately after integration and prior to the next integration interval to develop a sampled voltage representative of said error voltage; said sample means including, a sampling capacitor for accumulating a charging level proportional to said error voltage, sampling amplifier means including a sampling amplifier having an output connected to the sampling capacitor input, first gate means connected immediately the sampling amplifier input and the integrating amplifier output terminal, and second gate means connected intermediate the sampling capacitor output and said integrating amplifier input terminal; and transfer means for transferring said sampled voltage to said integrating capacitor during the next integration interval to compensate for said error voltage.

6. The improvement of claim 5, wherein said sample means and said transfer means includes timed control means for sequentially operating said first gate means after integration to enable said sampling capacitor to accumulate said charging level proportional to said error voltage, and thereafter operating said second gate means during the next integration interval to transfer said accumulated charging level from said sampling capacitor to said integrating capacitor to substantially eliminate said error voltage.

7. In an electronic integrating circuit, including an integrating amplifier with input and output terminals, and an integrating capacitor, connected between said terminals, having dielectric absorption, the dielectric absorption causing an error voltage upon integration, wherein the improvement comprises:

sample means for sampling the error voltage immediately after integration and prior to the next integration interval to develop a sampled voltage representative of said error voltage;

transfer means for transferring said sampled voltage to said integrating capacitor during the next integration interval to compensate for said error voltage; and timed control means defining a sampling interval and an integrating interval, said timed control means coupled to said sample means and said transfer means for controlling said sampling of said error voltage during the sampling interval, and the transfer of said sampled voltage to said integrating capacitor during the integrating interval.

8. In an electronic integrating circuit, including an integrating amplifier with input and output terminals, and an integrating capacitor, connected between said terminals, having dielectric absorption, the dielectric absorption causing an error voltage upon integration, wherein the improvement comprises:

sample means for sampling the error voltage immediately after integration and prior to the next integration interval to develop a sampled voltage representative of said error voltage, said sample means including;

a sampling capacitor having an input terminal coupled to said integrating amplifier and said integrating capacitor at said integrating amplifier output terminal, and an output terminal selectively coupled to said integrating capacitor at said integrating amplifier input terminal, said sampling capacitor selectively coupled to said integrating amplifier output terminal immediately after an integration interval for accumulating a charging level proportional to said error voltage;

transfer means for transferring said sampled voltage from said sampled capacitor to said integrating capacitor during the next integration interval to compensate for said error voltage;

said transfer means including gate means actuable immediately upon initiation of said next integration interval to immediately transfer said charging level on said sampling capacitor to said integration capacitor, resulting in a voltage step at said integration amplifier output terminal opposite in polarity to the voltage present immediately prior to the initiation of said next integration interval.

9. The improvement of claim 8, wherein said transfer means further includes a first resistor ($R_{34}$) having one end connected to the input of said sampling capacitor ($C_{28}$), a second resistor ($R_{32}$) having one end connected to said integrating capacitor ($C_{18}$) output, and means connecting said other ends of said first and second resistors, wherein the magnitude of said voltage step is a product ratio, $R_{34}\,C_{28}/R_{32}\,C_{18}$.

* * * * *